United States Patent
Irrinki et al.

[11] Patent Number: 6,067,262
[45] Date of Patent: *May 23, 2000

[54] REDUNDANCY ANALYSIS FOR EMBEDDED MEMORIES WITH BUILT-IN SELF TEST AND BUILT-IN SELF REPAIR

[75] Inventors: V. Swamy Irrinki, Milpitas; Tuan L. Phan; William D. Schwarz, both of San Jose, all of Calif.

[73] Assignee: LSI Logic Corporation, Milpitas, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/209,938

[22] Filed: Dec. 11, 1998

[51] Int. Cl.⁷ .................................................. G11C 7/00
[52] U.S. Cl. ........................ 365/201; 365/200; 371/21.1; 371/22.5
[58] Field of Search ................................... 365/201, 200; 371/21.1, 22.5

[56] References Cited

U.S. PATENT DOCUMENTS

| | | | |
|---|---|---|---|
| H1741 | 7/1998 | Cruts . | |
| 5,068,547 | 11/1991 | Gascoyne | 307/443 |
| 5,155,432 | 10/1992 | Mahoney | 324/763 |
| 5,249,281 | 9/1993 | Fuccio et al. | 395/425 |
| 5,375,091 | 12/1994 | Berry, Jr. et al. | 365/201 |
| 5,381,417 | 1/1995 | Loopik et al. | 371/22.1 |
| 5,486,786 | 1/1996 | Lee | 327/378 |
| 5,497,381 | 3/1996 | O'Donoghue et al. . | |
| 5,524,114 | 6/1996 | Peng | 371/22.1 |
| 5,533,194 | 7/1996 | Albin et al. . | |
| 5,535,164 | 7/1996 | Adams et al. | 365/201 |
| 5,574,692 | 11/1996 | Dierke | 365/201 |
| 5,577,050 | 11/1996 | Bair et al. | 371/10.2 |
| 5,608,257 | 3/1997 | Lee et al. | 257/529 |
| 5,631,868 | 5/1997 | Termullo, Jr. et al. | 365/201 X |
| 5,633,599 | 5/1997 | Kubota | 326/16 |
| 5,646,948 | 7/1997 | Kobayashi et al. | 371/21.2 |
| 5,663,967 | 9/1997 | Lindberg et al. | 371/26 |
| 5,734,615 | 3/1998 | Dierke | 365/201 |
| 5,748,543 | 5/1998 | Lee et al. . | |
| 5,761,489 | 6/1998 | Broseghini et al. | 395/568 |
| 5,764,878 | 6/1998 | Kablanian et al. | 395/182.05 |
| 5,822,228 | 10/1998 | Irrinki et al. | 364/580 |
| 5,909,404 | 6/1999 | Schwarz . | |
| 5,920,515 | 7/1999 | Shaik et al. . | |
| 5,956,350 | 9/1999 | Irrinki et al. . | |

*Primary Examiner*—Huan Hoang
*Attorney, Agent, or Firm*—Akin, Gump, Strauss, Hauer & Feld LLP

[57] ABSTRACT

An efficient methodology for detecting and rejecting faulty integrated circuits with embedded memories utilizing stress factors during the manufacturing production testing process. In the disclosed embodiment of the invention, a stress factor is applied to an integrated circuit having built-in-self-test (BIST) circuitry and built-in-self-repair (BISR) circuitry. A BIST run is then performed on a predetermined portion of the integrated circuit to detect a set of faulty memory locations. The results of this first BIST run are stored. A second condition is applied to the die and a second BIST run is executed to generate a second set of faulty memory locations. The results of the second BIST run are stored and compared with the first result. If the results differ, the integrated circuit is rejected. Thus, a methodology for screening out field errors at the factory is disclosed using BIST/BISR circuitry.

22 Claims, 5 Drawing Sheets

REDUNDANCY ANALYSIS FOR EMBEDDED MEMORIES WITH BUILT-IN SELF TEST AND BUILT-IN SELF REPAIR

BACKGROUND OF THE INVENTION

1. Field of the Invention

The present invention relates to testing and self-repair of integrated circuit die, and more particularly to a method for introducing stress factors to the BIST and BISR algorithms during the manufacturing test cycle.

2. Description of the Related Art

Integrated circuits have become key components of many consumer and commercial electronic products, often replacing discrete components and enhancing functionality. The semiconductor processing technologies that produce these integrated circuits have advanced to the point where complete systems, including memories, can be reduced to a single integrated circuit or application specific integrated circuit (ASIC) device. It is a common practice for the manufacturers of such integrated circuits to thoroughly test device functionality at the manufacturing site. Because of the increasing complexity of new designs, test development costs now account for a large percentage of the total ASIC development cost.

Before integrated circuits (or "chips") are released for shipment by a manufacturer, the devices typically undergo a variety of testing procedures. In ASIC devices incorporating integrated memories, for example, specific tests are carried out to verify that each of the memory cells within the integrated memory array(s) is functioning properly. This testing is necessary because perfect yields are difficult to achieve. It is not uncommon for a certain percentage of unpackaged ASIC die to contain memory cells which fail testing processes, due largely to non-systemic manufacturing defects and degradation faults. Such manufacturing issues are likely to increase as process geometries continue to shrink and the density of memory cells increases. Even today, up to 100 Mbits or more of dynamic random access memory (DRAM), or several megabits of static random access memory (SRAM) or flash memory, as well as mixed-signal functions can be integrated onto a single integrated circuit.

A number of ASIC memory testing strategies have evolved, many of which involve use of an external memory tester or Automated Test Equipment (ATE). If memory is accessible from input/output (I/O) pins, either directly or by multiplexing, a hardware test mode can be utilized. In this mode, a production test system accesses the memory directly by writing to and reading from the memory bits. While this methodology does not utilize any chip area other than some simple multiplexing circuitry, it is limited to on-chip memories and other circuitry accessible via I/O pins. Another drawback of this approach is that ATE capabilities are generally not available to end users once the devices have been shipped, making it difficult to detect faults occurring after shipment.

If an embedded memory is buried deeply within an ASIC, built-in self-test (BIST) is often considered the most practical and efficient test methodology and is becoming increasingly popular with semiconductor vendors. BIST allows the memory to be tested quickly with a reasonably high degree of fault coverage, without requiring complex external test equipment and large amounts of external access circuitry. One advantage BIST has over many traditional testing methods is that with BIST, memory or logic circuitry can be tested at any time in the field. This capability offers some degree of continued fault protection.

BIST refers in general to any test technique in which test vectors are generated internal to an integrated circuit or ASIC. Test vectors are sequences of signals that are applied to integrated circuitry to determine if the integrated circuitry is performing as designed. BIST can be used to test memories located anywhere on the ASIC without requiring dedicated I/O pins, and can be used to test memory or logic circuitry every time power is applied to the ASIC, thereby allowing an ASIC to be easily tested after it has been incorporated in an end product. A number of software tools exist for automatically generating BIST circuitry, including RAMBIST Builder by LSI Logic of Milpitas, California. Such software produces area-efficient BIST circuitry for testing memories, and reduces time-to-market and test development costs.

In the BIST approach, a test pattern generator and test response analyzer are incorporated directly into the device to be tested. BIST operation is controlled by supplying an external clock and utilizing a simple commencement protocol. BIST test results are typically compressed—usually to the level of "passed" or "failed". At the end of a typical structured BIST test, or "run", a simple pass/fail signal is asserted, indicating whether the device passed or failed the test. Intermediate pass/fail signals may also be provided, allowing individual memory locations or group of locations to be analyzed. Unlike external testing approaches, at-speed testing with BIST is readily achieved. BIST also alleviates the need for long and convoluted test vectors and may function as a surrogate for functional testing or scan testing. Further, since the BIST structures remain active on the device, BIST can be employed at the board or system level to yield reduced system testing costs, and to reduce field diagnosis and repair costs.

In addition to the aforementioned testing procedures, manufacturers utilize a number of techniques to repair faulty memories when feasible. Such techniques include bypassing defective cells using laser procedures and fused links that cause address redirection. However, such techniques are limited to one-time repair and require significant capital investment. Further, these techniques may leave integrated circuits useless if the repaired memories become defective after shipment from the manufacturing site—even where test equipment is available to end users, traditional field repairs have been expensive, time consuming, and largely impracticable.

In order to enhance the repair process, on-chip built-in self repair (BISR) circuitry for repairing faulty memory cells has evolved. BISR circuitry functions internal to the integrated circuit without detailed interaction with external test or repair equipment. In the BISR approach, suitable test algorithms are preferably developed and implemented in BIST or BIST-like circuitry. These test patterns may be capable of detecting stuck-at, stuck-open, and bridging faults during memory column tests, as well as memory cell faults and retention faults during memory row tests. Following execution of the test patterns, the BISR circuitry analyzes the BIST "signature" (results) and, in the event of detected faults, automatically reconfigures the defective memory utilizing redundant memory elements to replace the defective ones. A memory incorporating BISR is therefore defect-tolerant. The assignee of the present invention, LSI Logic Corporation, has addressed different methods of repairing faulty memory locations utilizing BIST and BISR circuitry, as disclosed in U.S. patent application Ser. No. 08/970,030, entitled "METHOD FOR SEPARATING PRIME AND REPAIRED INTEGRATED CIRCUITS INCORPORATING BUILT-IN SELF TEST AND BUILT- IN SELF REPAIR CIRCUITRY," and hereby incorporated by reference as if set forth in its entirety.

BISR compliments BIST because it takes advantage of on-chip processing capabilities to re-route bad memory bits rather than using an expensive and slow laser burning process to replace faulty memory locations. Some BISR circuitry is capable of repairing the faulty memory locations by redirecting the original address locations of faulty memory lines to the mapped addressed locations of the redundant columns and rows. Options for repair include either row and column replacement when a bad bit is found in a particular row or column, or single bit replacement involving storing the addresses of bad bits in a Content Addressable Memory (CAM). If faults are randomly distributed, single bit replacement may prove to be more space efficient. However, if faults are detected involving large areas of memory in the forms of rows or columns, replacement of entire rows or columns is preferable.

During the testing process, it is often desirable to separate so-called "prime die" (integrated circuit die in which no redundant BISR memory components were utilized during initial testing) from "repaired die". Separating integrated circuit die in this manner provides an indication of quality and fault tolerance. Because the BIST and BISR circuitry of an integrated circuit continue to be functional in the field, any BISR redundancy resources not expended during initial testing are available to repair faults that may occur in the field. As a consequence, prime die have a higher degree of fault tolerance, and can often be sold by manufacturers for a premium.

A key feature of any integrated circuit is its reliability. Engineers strive to design integrated circuits that operate under a range of conditions (including temperatures and voltages) without malfunctioning. Therefore, it is often desirable to test dies (or "dice") under realistic field conditions during the manufacturing production cycle to ensure operability. This testing is done prior to singulation of the dies from a wafer. Furthermore, instead of using costly external test patterns to test memory locations, it is desirable to use the BIST circuitry with external ATE. The external tester is programmed to "test" a die's embedded memory by examining the outputs of the its BIST circuitry. With stand alone memory devices, manufacturers use dedicated memory ATEs to test them over a range of conditions. Typically, a worst set of operating conditions is applied and any detected faults, if possible, are repaired using fuse structures. This approach may not work for integrated circuits incorporating embedded memories and BIST/BISR capabilities, as test and repair routines are generally executed only at power-up.

Running current BIST algorithms may not adequately detect memory locations having faults that are dependent on operating conditions. Even with BIST/BISR, memory elements can pass power-up BIST under one set of conditions, only to fail during normal operation when the die is subsequently subjected to another set of conditions. Since BIST/BISR is typically run only once during a power cycle, any memory locations that fail after power-up may not be repaired. Such failures may cause the chip to be unsuitable for its intended use.

Prior methods fail to introduce realistic field conditions or stress factors (e.g., normal variation in voltage, timing, power supply disturbances and temperature) during these tests to insure adequate fault coverage. Consequently, suspect memory locations that pass under an initial set of operating conditions but fail under a subsequent set of operating conditions may not be identified by current production test programs. Further, since BISR structures have a limited number of redundant memory locations, a device may be repairable only under select operating conditions. Thus, a need exists for a method to detect memory locations that fail under one stress factor(s) and not another.

SUMMARY OF THE INVENTION

The present invention provides an efficient method of improving fault coverage during manufacturing testing of integrated circuits having structures such as embedded memories. In the disclosed embodiment of the invention, an initial set of operating conditions is applied to the die under test, an initial BIST run is performed and the error capture results of the first BIST run are stored in a BIST/BISR FLARESCAN register. Typically, the results indicate which memory location has failed the BIST. Such locations can normally be repaired by BISR. The results are scanned out to a repair file on the ATE with lot, wafer and die identification. A second set of operating conditions is then applied to the die under test and a second BIST run is preformed. The BIST error capture results from the second run replace the first run results in the FLARESCAN register. The results from the second run are then scanned out to the same repair file in the ATE, and include lot, wafer and die identification information. Error capture results are collected for all remaining dies of a wafer. Then, with simple software routines running on the ATE workstation, the different error capture strings are collapsed into a single string by looking for common failure modes under different stress conditions. Based on the number of spare memory elements available and common failure mode, each die is classified as prime, repairable, or unrepairable and a corresponding wafer map is generated. If failures are detected at one set of operating conditions but not another, the die under test is rejected. Both prime and repairable dies are assembled and unrepairable dies can be used for failure analysis for further yield enhancement. This novel methodology of redundancy analysis allows circuits with self-repair capabilities (such as embedded memories) to be tested using a standard logic tester, and permits detection of likely field errors that are dependent on operating conditions, thereby increasing the quality of the product.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
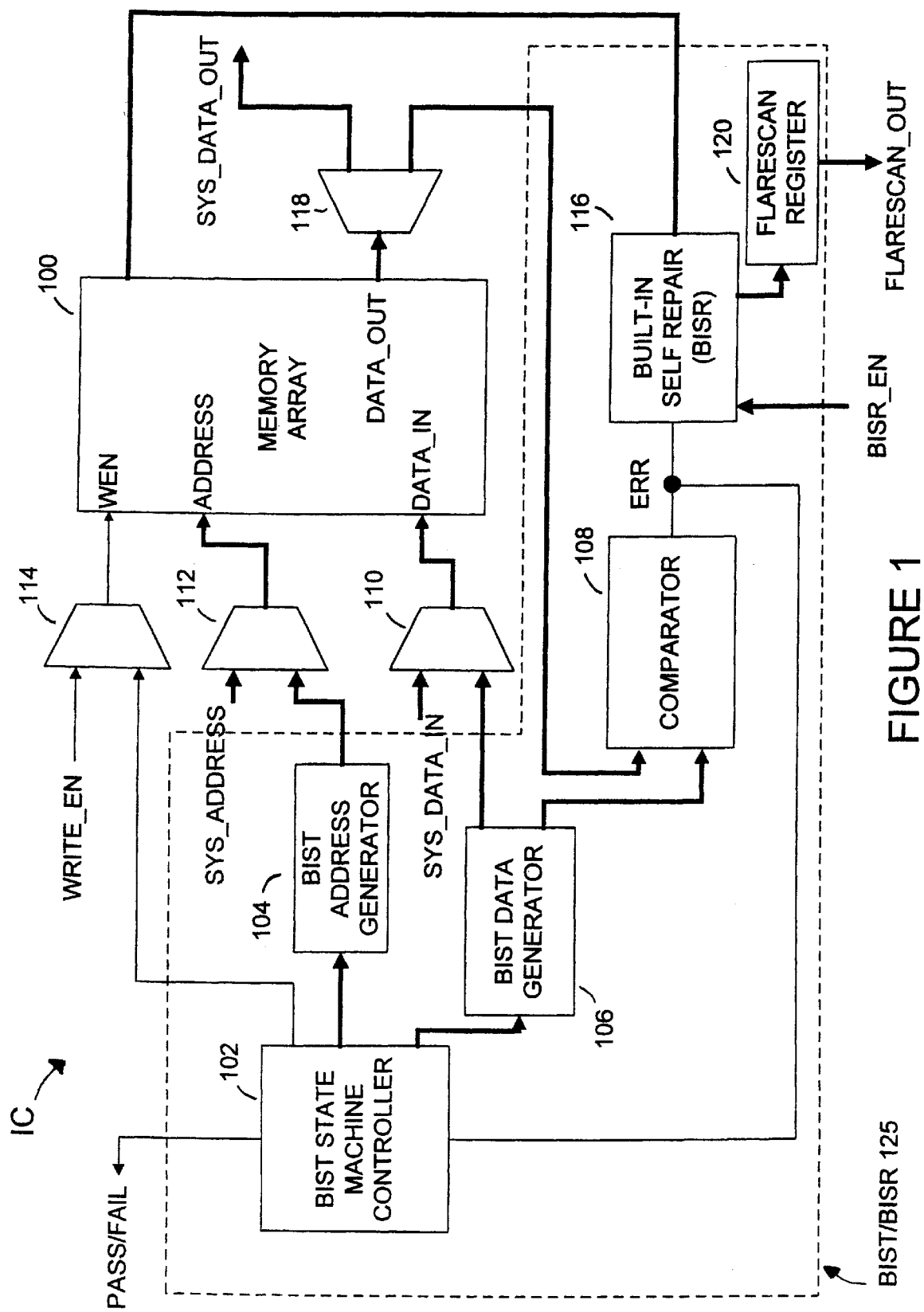
FIG. 1 is a schematic diagram of an integrated circuit incorporating BIST and BISR according to the present invention.

Turning now to the drawings, FIG. 1 provides a simplified schematic diagram of an integrated circuit IC incorporating testing capabilities according to the present invention. The system comprises a built-in self-test (BIST) state machine/ controller 102 for controlling the various other components of the disclosed memory BIST system, a built-in self repair (BISR) circuit 116, and a memory array 100. In addition to the BIST state machine/controller 102, other components of the BIST circuitry include an address generator 104, a data generator 106, a comparator 108, and multiplexers 110, 112, and 114 and demultiplexer 118. The BIST circuitry functions to generate and execute test patterns for detecting column and row faults in the memory array 100. The BISR circuitry 116 is coupled to the memory array 100 to repair detected column and/or row faults by any of a number of techniques, including redirecting the original address locations of faulty memory lines to the mapped address locations of redundancy lines.

In the disclosed embodiment of the invention, the BIST state machine/controller 102 includes a test pattern generator to generate test pattern algorithms used to detect various types of memory faults, including column line faults, row faults, and retention faults. The test pattern generator is preferably configured to produce a pattern that provides optimal fault coverage in identifying faulty memory cells. A memory BIST process for use with the present invention can be implemented in several different ways, including a simple one-pass process which only provides pass/fail information to complex, multi-pass systems with several diagnostic modes.

There are two main types of deterministic memory test pattern algorithms: a "march" test and a "neighbor pattern sensitive" test. Either of these tests (or others) could be utilized in an integrated circuit IC according to the present invention. The march test generally refers to a finite sequence of tests performed on each cell in a memory array 100. All of the cells of the memory array 100 are subjected to the same test, and memory cells are tested in either forward or reverse order. March tests are capable of covering all address faults, stuck-at faults, independent coupling faults, linked coupling faults, transition faults, and transition faults linked with coupling faults. Neighbor pattern sensitive tests involve testing every cell of the memory array 100 in relation to the set of neighboring cells, including a base cell. These tests generally require more time to run than march tests, and are capable of covering active, passive, and static neighborhood pattern sensitive faults. Such faults may include stuck-at faults and all coupling and transition faults between physically adjacent memory cells. Since very little external equipment is necessary to test integrated circuit components covered by BIST circuitry, it is often possible to run these types of tests after the manufacturing process has been completed, allowing end users to periodically test functionality and improve reliability.

On-chip BIST structures such as the BIST state machine/controller 102 typically communicate with external devices via an IEEE 1149.1 compliant interface. When implemented with this interface, IEEE 1149.1 test access port (TAP) and boundary scan structures (not shown) are also present on the integrated circuit IC. When implemented in such a fashion, a simple command sequence initiates BIST operation. After the BIST circuitry has completed its test patterns, the BIST state machine/controller 102 scans the results to off-chip test equipment via the test access port.

The various outputs of the BIST state machine/controller 102 shown in FIG. 1 provide the logical states and inputs for the memory array 100 during testing, and are provided in a sequence as specified by a test pattern algorithm. More specifically, the BIST state machine/controller 102 provides inputs and control signals to the BIST address generator 104 and the BIST data generator 106. The BIST state machine/controller 102 also drives one input to the two-input multiplexer 114, which controls a write enable input WEN of the memory array 100. Separating the BIST state machine/controller 102 and the multiplexers 110, 112, and 114 into separate layout blocks minimizes the impact of the BIST circuitry on the routing of the address and input data lines of the integrated circuit IC. Likewise, a demultiplexer 118 routes the memory array 100 output data to either the system during normal operation or to the BIST comparator 108 during BIST operation.

The DATA_IN inputs of the memory array 100 are driven by the output(s) of the multiplexer 110. The inputs of the multiplexer 110 include data bus signals SYS_DATA_IN provided by other components or input pins of the integrated circuit IC. Additional inputs and control signals for the multiplexer 110 are provided by the BIST data generator 106 as determined by the BIST state machine controller 102. The outputs of the BIST data generator 106 are applied to the DATA_IN inputs (via the multiplexer 110) of the memory array 100 during testing procedures, while the data bus signals SYS_DATA_IN are provided to the memory array 100 during normal operation of the integrated circuit IC.

Similarly, the ADDRESS inputs of the memory array 100 are driven by the output(s) of the multiplexer 112. The inputs of this multiplexer 112 are provided by address bus signals SYS_ADDRESS from other components or input pins of the integrated circuit IC. Additional inputs and control signals for the multiplexer 112 are provided by the BIST address generator 104. The outputs of the BIST address generator 104 thereby control the address inputs of the memory array 100 during execution of a test pattern algorithm. Thus, the BIST address generator 104 and BIST data generator 106 provide address and data sequences, respectively, to the memory array 100 in an order as specified by a test pattern algorithm. Preferably, such sequences provide a set of data bits in a pattern that maximizes fault coverage for detecting various types of faults within the memory array 100.

The write enable input WEN of the memory array 100 is driven by the BIST state machine controller 102 through the multiplexer 114 during testing. A write enable signal WRITE_EN provided by other integrated circuit IC components or input pins controls the WEN input of the memory array 100 input during normal operation of the integrated circuit IC.

During testing, data patterns provided to the memory array 100 by the BIST circuitry are propagated through the memory array 100 to DATA_OUT outputs. Under BIST operation, these outputs are routed by demultiplexer 118 for provision to the comparator 108, which compares the outputs of the memory array 100 on a read cycle against the corresponding binary bits produced by the BIST data generator 106 on the initiating write cycle. In the disclosed embodiment of the invention, the memory array 100 may be a dynamic random access memory (DRAM), a static random access memory (SRAM), a read-only memory (ROM), or any other type of circuitry having a structured array(s) of elements.

In the disclosed embodiment of the invention, an output signal ERR driven by the output of the comparator 108, is provided to the BISR 116 and the BIST state machine controller 102. After DATA_IN data from the BIST data generator 106 has propagated through memory array 100, a DATA_OUT signal is fed back to the comparator 108, which compares data DATA_IN on the read cycle against data DATA_OUT on the write cycle. If there is no difference between DATA_IN and DATA_OUT, then the error signal ERR is not asserted. If there is a difference, the ERR signal is asserted to indicate that a fault has been detected at that particular memory location. The address of the faulty memory location can then be obtained from the BISR circuitry 116 and captured by the FLARESCAN register 120. On the ATE, the contents of the FLARESCAN register 120 can be scanned out via line FLARESCAN_OUT. Table 1 is a printout of a sample bit capture file of a FLARESCAN register representing faulty memory locations of different die on a single wafer. Data from subsequent BIST runs would be compared to determine whether memory locations fail under different stress factors.

faulty memory address locations, generated in step 308. The set of faulty memory address locations is retrieved and stored in the external tester 200 at step 310.

Figure 3A:
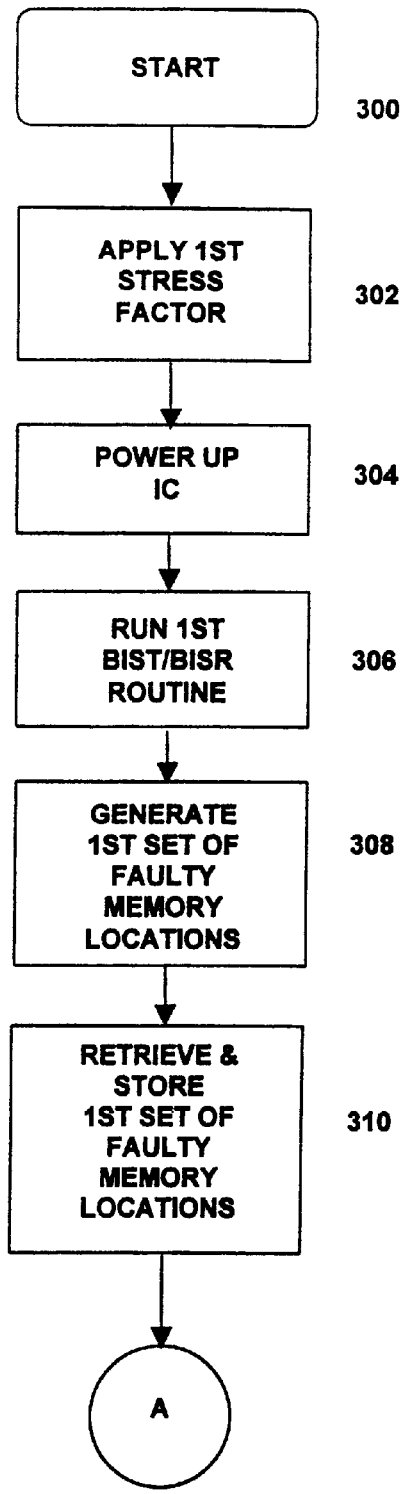
FIGS. 3A, 3B, and 3C are flowchart illustrations of an exemplary testing procedure in accordance with the present invention.
Figure 3B:
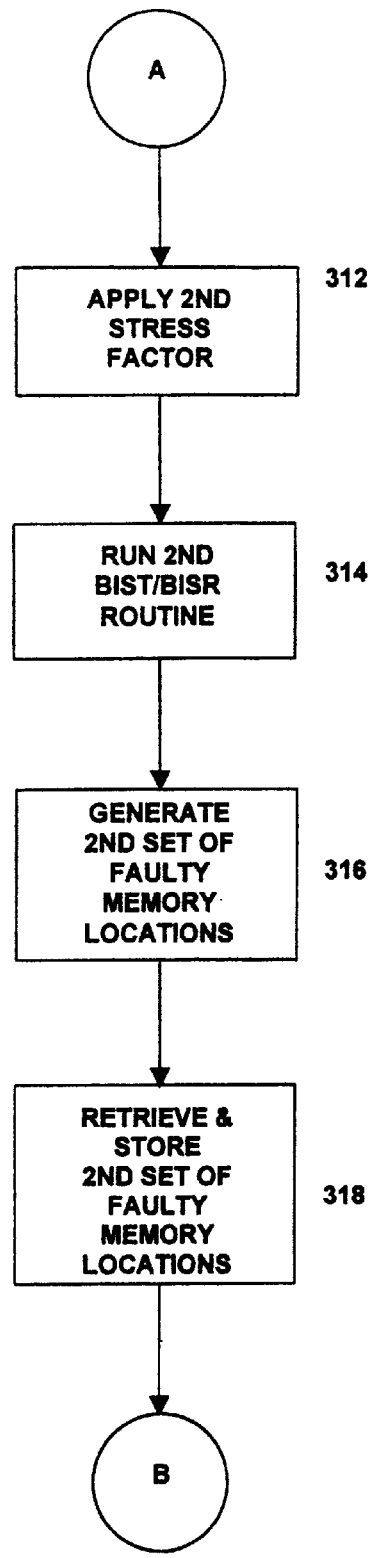

Next, a second stress factor or set of stress factors is applied in step 312 (FIG. 3B). For example, the die may be subjected to a maximum specified temperature, or another stress factor such as a supply voltage variation. A second BIST/BISR run is initiated at step 314. The BIST/BISR circuitry 125 generates the second results, namely a second set of faulty memory address locations, of the second BIST/BISR run in step 316. The results are retrieved and stored in the external tester 200 at step 318.

At step 320 (FIG. 3C), if the results indicate that none of the memory address locations failed both BIST/BISR runs,

TABLE 1

FLARESCAN BIT CAPTURE FILE

Z733163R.1  W03  X129  Y131  0000000000000000000000000000000000000000000000000000
000000000000000000000000000000000000000000000000000000000000000000000000000000000
0000000000000000000000000000000000000000000000000000
Z733163R.1  W03  X128  Y131  0000000000000000000000000000000000000000000000000000
000000000000000000000000000000000000000000000000000000000000000001111111101010000000
0000000000000000000000000000001111111101110000000000000
Z733163R.1  W03  X126  Y130  0000000000000000000000000000000000000000000000000000
00000000000000000000000011111111011000000000000000000000000001111111110010000000000000000
00000001111111100111111111111101111111111110111000000000000

Figure 2:
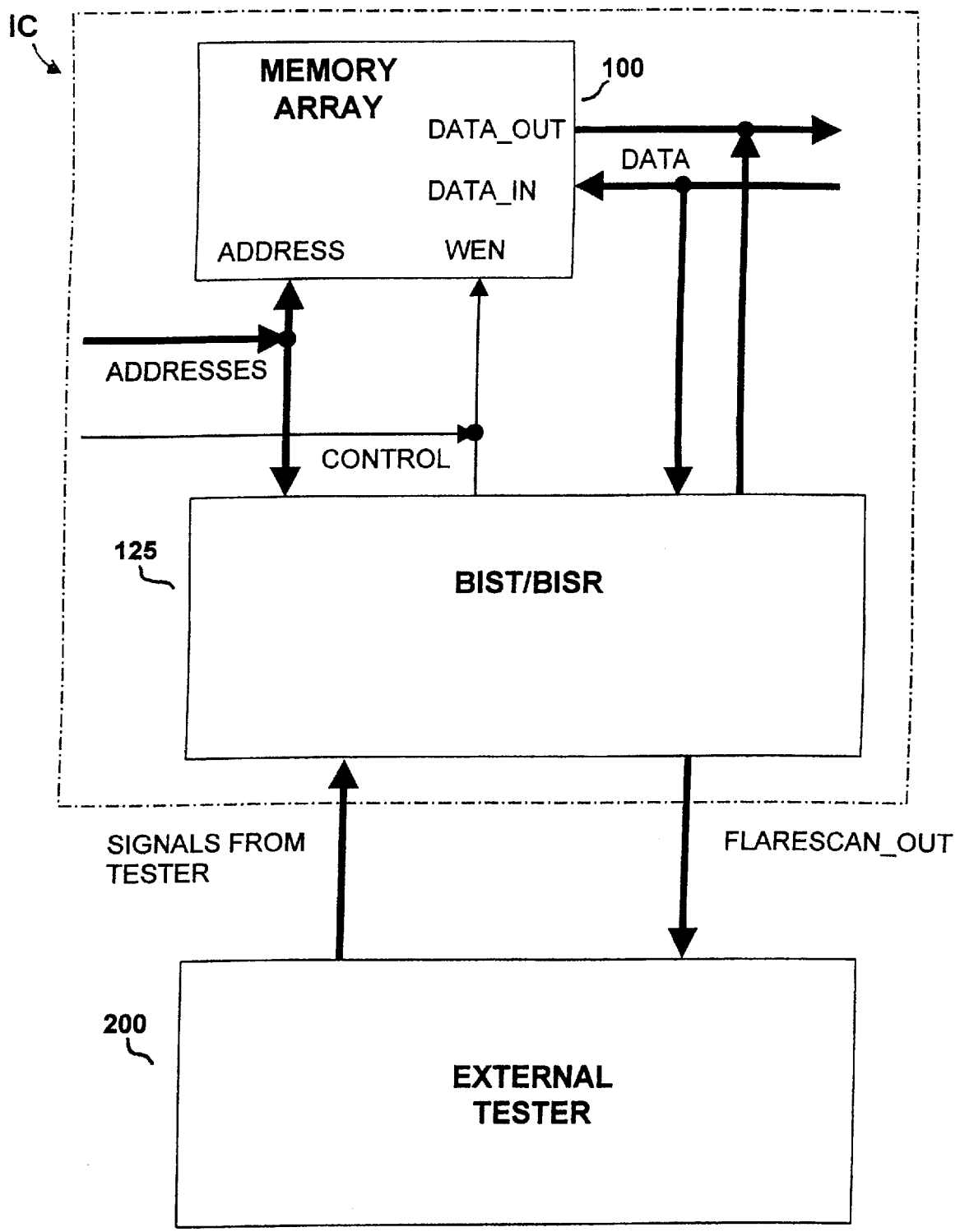
FIG. 2 is a block diagram of a test system and an integrated circuit incorporating testing capabilities according to the present invention.

Next, FIG. 2 provides a simplified block diagram of an integrated circuit IC incorporating testing capabilities according to the present invention communicatively coupled to an external tester 200. The BIST/BISR circuitry 125 interfaces with both the memory array 100 and the external tester 200. Via control lines 210, the external tester coordinates execution of the test algorithms of the BIST/BISR circuitry 125. The addresses of memory locations from memory array 100 that fail BIST analysis are provided from the BIST/BISR circuitry 125 to external tester 200 via the register output FLARESCAN_OUT or similar means. The illustrated test system is exemplary in nature, and the precise arrangement and electrical couplings between the test system components is not considered critical to the invention. Many different circuit arrangements could be used to provide failure information from the integrated circuit IC to the external tester 200.

Figure 3C:
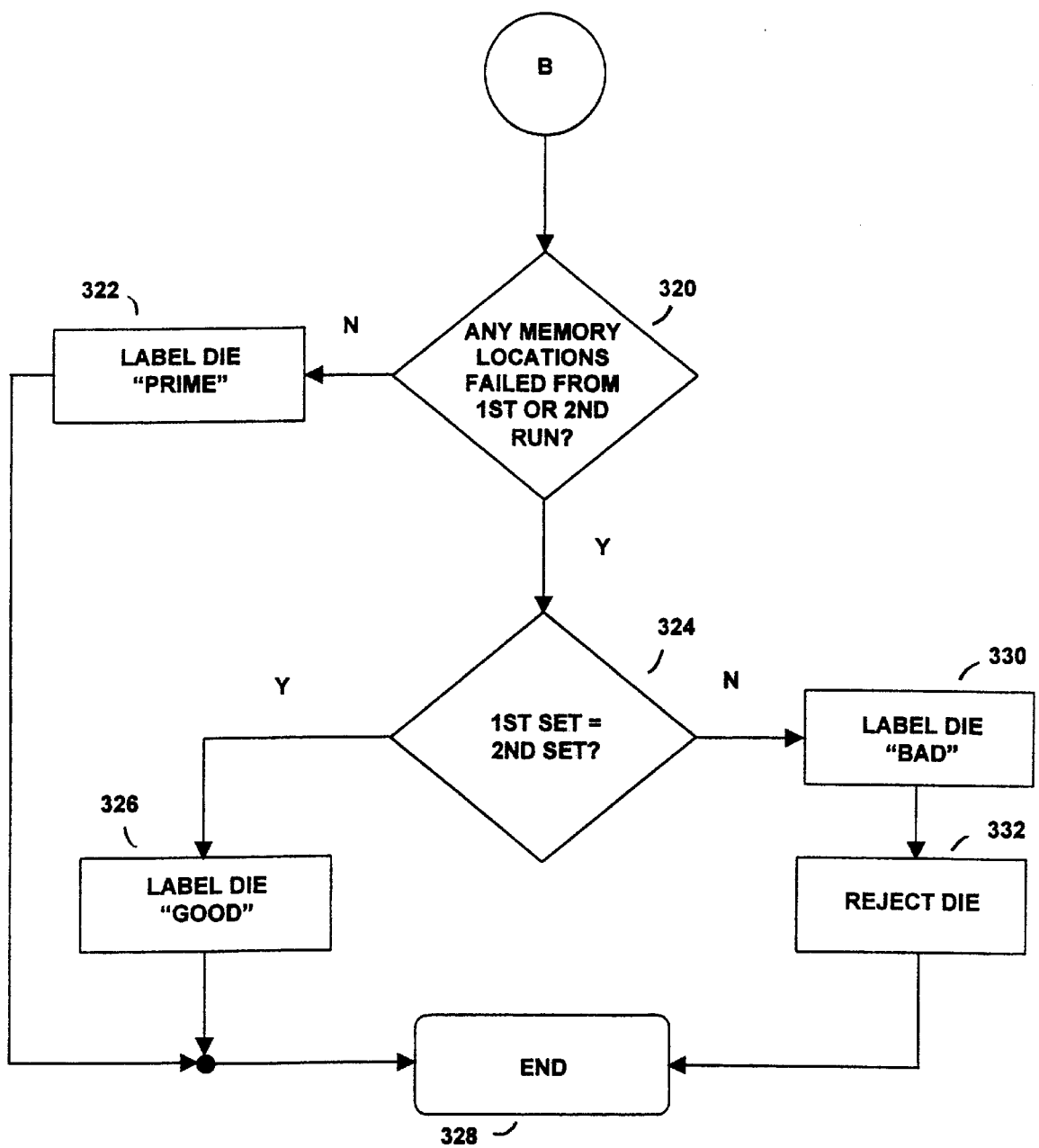

Referring now to FIGS. 3A, 3B and 3C, flowcharts of a testing procedure in accordance with the present invention are provided. The testing procedure involves an iterative process in which an initial BIST run is completed, followed by a second BIST run. The described testing procedure permits the identification of memory locations that fail while different stress factors/operating conditions are applied. It should be understood that the term "stress factors" refer to one or more environmental or operating conditions, such as temperature, voltage, and power supply disturbances.

Following commencement of the testing procedure 300 (FIG. 3A), a stress factor is applied to the die at step 302. As an example, the die may be subjected to a minimum temperature as specified in the device's data sheet. A certain time is allowed to elapse in order for the die to adjust to this temperature change. Next power is applied to the integrated circuit IC at step 304 and the integrated circuit IC executes a first BIST/BISR run at step 306. In the disclosed embodiment of the invention, diagnosis and repair of the integrated circuit IC by the BIST/BISR circuitry 125 are performed upon power-up or when initiated by the external tester 200.

Following execution of the first run, the BIST/BISR circuitry 125 generates the first results, namely the set of then the die is marked as "prime" at step 322 and the test procedure ends at step 328. One skilled in the art will appreciate that this determination need not necessarily be ascertained after both BIST/BISR runs but could be performed after each run. If there are faulty memory address locations, the external tester 200 compares the two sets of faulty memory locations at step 324. If the results indicate that any failing memory locations failed under both BIST/BISR runs, then the die is marked as a "good" die at step 326 and the test procedure ends at step 328. Subsequent analysis of the "good" die can be made to determine whether the die is repairable or unrepairable based on the number of failed memory locations versus the number of redundant memory elements. If unrepairable, the die can be used for failure analysis for further yield enhancement. At step 324, if the results indicate that a memory location has failed under one BIST/BISR run and not the other, then the die is marked as a "bad" die at step 330, the die is rejected at step 332 and the test procedure ends at step 328.

As noted, the invention is not limited to only applying one condition as a stress factor. One skilled in the art would appreciate that a stress factor may include a combination of factors, such as temperature and humidity, temperature and voltage, speed and voltage, etc. For example, temperature and voltage may be applied to the die under minimum/maximum conditions. BIST/BISR would then be run when the die is subjected to minimum temperature, and maximum voltage. In addition, BIST/BISR could be run when the die is subjected to maximum temperature, and minimum voltage. Consequently, the integrated circuit would be subjected to a host of stress factors and tested under these various conditions to ensure that reliable integrated circuits are shipped to the customers.

In addition, it is contemplated that the results of BIST/BISR procedures can be compared for any number of additional and different stress factors. Furthermore, one skilled in the art could appreciate that BIST could be utilized in electronic components of the integrated circuit other than embedded memories. The components that fail BIST under one set of stress factors and not the others could be rejected.

Thus, an efficient method has been disclosed for detecting faulty memory locations which have been subjected to various stress factors using BIST/BISR circuitry. In the disclosed embodiment of the invention, a die is subjected to a stress factor while an initial BIST run is performed. The results of this first BIST run identify faulty memory locations, if any, and are stored in an external tester. Next, a second stress factor is applied to the die and a second BIST run is executed. The results of the second BIST run identify a second set of faulty memory locations, if any, and are also stored in the external tester. The results are compared to determine if a particular memory location has passed BIST under one stress factor and not the other. Additional BIST runs under a variety of environmental and operating conditions can be similarly performed. A disparity between detected faulty memory locations provides an indication that the die under test may experience problems in the field. The present invention thereby provides an efficient method for manufacturing reliable fault-tolerant integrated circuits with embedded memories.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for testing integrated circuits having built-in self test and built-in self repair circuitry, comprising the steps of:
    applying a first stress factor to an integrated circuit die;
    performing a first built-in self test analysis to detect faults in a predetermined portion of the integrated circuit die;
    generating first fault information pertaining to any faults detected by the first built-in self test analysis;
    applying a second stress factor to the integrated circuit die;
    performing a second built-in self test analysis on the predetermined portion of the integrated circuit die;
    generating second fault information pertaining to any faults detected by the second built-in self test analysis; and
    comparing the first fault information with the second fault information to ascertain any differences.

2. The method of claim 1, further comprising the step of rejecting the integrated circuit die if the first fault information does not equal the second fault information.

3. The method of claim 1, further comprising the step of performing a built-in self repair procedure after generating the first fault information to reconfigure any faulty portions of the integrated circuit die as indicated by the first fault information.

4. The method of claim 1, wherein the first stress factor is a minimum temperature and second stress factor is a maximum temperature.

5. The method of claim 1, wherein the first stress factor is a minimum voltage and the second stress factor is a maximum voltage.

6. The method of claim 1, wherein the first fault information is a first set of memory address locations and the second fault information is a second set of memory address locations.

7. The method of claim 1, wherein the step of performing a first built-in self test analysis comprises the steps of:
    generating an initial test pattern via the built-in self test circuitry; and
    exercising the initial test pattern on the predetermined portion of the integrated circuit die.

8. The method of claim 7, wherein the step of performing a second built-in self test analysis comprises the steps of:
    generating a secondary test pattern via the built-in self test circuitry; and
    exercising the secondary test pattern on the predetermined portion of the integrated circuit die.

9. The method of claim 8, wherein the initial test pattern and the secondary test pattern are identical.

10. The method of claim 1, wherein the predetermined portion of the integrated circuit die comprises a memory.

11. The method of claim 10, wherein the memory is a dynamic random access memory.

12. The method of claim 10, wherein the memory is a static random access memory.

13. A method for testing integrated circuits with embedded memories and built-in self test and built-in self repair circuitry, comprising the steps of:
    applying a first stress factor to an integrated circuit die;
    performing a first built-in self test analysis to detect faults in a predetermined portion of the integrated circuit die;
    generating first fault information pertaining to any faults detected by the first built-in self test analysis;
    applying a second stress factor to the integrated circuit die;
    performing a second built-in self test analysis on the predetermined portion of the integrated circuit die;
    generating second fault information pertaining to any faults detected by the second built-in self test analysis;
    applying at least one additional stress factor;
    performing at least one additional built-in self test analysis on the predetermined portion of the integrated circuit die;
    generating at least one additional fault information pertaining to any faults detected by the additional built-in test analysis; and
    comparing the first fault information, the second fault information and the at least one additional fault information to ascertain any differences.

14. The method of claim 13, further comprising the step of rejecting the integrated circuit die if the first fault information, the second fault information or the at least one additional fault information do not equal one another.

15. The method of claim 13, wherein the first fault information is a first set of memory address locations, the second fault information is a second set of memory address locations and the at least one additional fault information is an least one additional set of memory address locations.

16. The method of claim 13, wherein the step of performing a first built-in self test analysis comprises the steps of:
    generating an initial test pattern via the built-in self test circuitry; and
    exercising the initial test pattern on the predetermined portion of the integrated circuit die.

17. The method of claim 16, wherein the step of performing a second built-in self test analysis comprises the steps of:
    generating a secondary test pattern via the built-in self test circuitry; and
    exercising the secondary test pattern on the predetermined portion of the integrated circuit die.

18. The method of claim 17, wherein the step of performing an least one additional built-in self test analysis comprises the steps of:
    generating a least one additional test pattern via the built-in self test circuitry; and exercising the at least one additional test pattern on the predetermined portion of the integrated circuit die.

19. The method of claim 18, wherein the initial test pattern, the secondary test pattern and the at least one additional test pattern are identical.

20. The method of claim 18, wherein the initial test pattern, the secondary test pattern and the at least one additional test pattern comprise a march algorithm.

21. The method of claim 18, the initial test pattern, the secondary test pattern and the at least one additional test pattern comprise a neighbor pattern sensitive algorithm.

22. The method of claim 13, wherein the predetermined portion of the integrated circuit die comprises a memory.

* * * * *